United States Patent  (10) Patent No.: US 9,012,244 B2
Huang et al.  (45) Date of Patent: Apr. 21, 2015

(54) METHOD TO FORM MULTIPLE TRENCHES UTILIZING A GRAYSCALE MASK

(71) Applicant: Taiwan Semiconductor Manufacturing Co. Ltd., Hsin-Chu (TW)

(72) Inventors: Lin-Ya Huang, Hsinchu (TW); Chi-Sheng Juan, Zhubei (TW); Chien-Lin Tseng, Zhubei (TW); Chang-Sheng Tsao, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 152 days.

(21) Appl. No.: 13/674,223

(22) Filed: Nov. 12, 2012

(65) Prior Publication Data

US 2014/0134757 A1    May 15, 2014

(51) Int. Cl.
*H01L 21/027* (2006.01)
*H01L 21/308* (2006.01)
*H01L 21/311* (2006.01)
*H01L 21/8234* (2006.01)
*H01L 21/768* (2006.01)

(52) U.S. Cl.
CPC ........ *H01L 21/0274* (2013.01); *H01L 21/3086* (2013.01); *H01L 21/31144* (2013.01); *H01L 21/823456* (2013.01); *H01L 21/823475* (2013.01); *H01L 21/76816* (2013.01)

(58) Field of Classification Search
USPC ............ 438/7, 158, 166, 155, 700, 427, 161; 216/2, 41, 58, 39; 430/30, 313, 22, 430/324, 326
See application file for complete search history.

(56) References Cited

U.S. PATENT DOCUMENTS

| 7,759,186 | B2 * | 7/2010 | Imhoff et al. ................ 438/212 |
| 7,935,583 | B2 * | 5/2011 | Jan et al. ...................... 438/155 |
| 8,435,415 | B2 * | 5/2013 | Stavis et al. .................... 216/41 |
| 8,476,153 | B2 * | 7/2013 | Tezuka et al. ................ 438/517 |
| 2002/0089787 | A1 * | 7/2002 | Lu et al. ..................... 360/235.1 |
| 2003/0003382 | A1 * | 1/2003 | Sherrer et al. ................. 430/22 |
| 2005/0260780 | A1 * | 11/2005 | Ahn ............................... 438/30 |
| 2008/0068699 | A1 * | 3/2008 | Miles ........................... 359/247 |
| 2009/0023098 | A1 * | 1/2009 | Jain et al. ..................... 430/296 |
| 2011/0116705 | A1 * | 5/2011 | Heo et al. .................... 382/145 |
| 2014/0085840 | A1 * | 3/2014 | Park et al. .................... 361/760 |

OTHER PUBLICATIONS

Lance Mosher, et al., "Double-Exposure Grayscale Photolithography", Journal of Microelectromechanical Systems, vol. 18, No. 2, Apr. 2009.

* cited by examiner

*Primary Examiner* — Savitr Mulpuri
(74) *Attorney, Agent, or Firm* — Eschweiler & Associates, LLC

(57) ABSTRACT

The present disclosure relates to a method to form a plurality of openings within a substrate with a single photo exposure and a single etch process. A photoresist layer is disposed over a substrate and aligned with a photomask, wherein the photomask comprises a transparent area, a grayscale area, and an opaque area. The photomask and substrate are exposed to radiation comprising a single illumination step to form a first 3-dimensional pattern within the photoresist layer. The 3-dimensional pattern comprises a first opening comprising a first thickness formed by transmitting the radiation through the transparent area with full intensity, and a second opening comprising a second thickness formed by transmitting the radiation through the grayscale area with partial intensity. The 3-dimensional pattern is transferred to form a plurality of openings of varying depths within the substrate through a single etch step.

16 Claims, 5 Drawing Sheets

METHOD TO FORM MULTIPLE TRENCHES UTILIZING A GRAYSCALE MASK

BACKGROUND

Fabrication of a variety of device types such as a plurality of field-effect transistors (FETs) to support multiple voltage domains within a single integrated circuit (IC) can drive diverse device topologies for complementary metal oxide semiconductor (CMOS) device structures comprising the IC. Multiple photo exposure and multiple etch processes to support shallow trench isolation of the plurality of FETs or to form contacts of various heights to align with topologies of CMOS devices can add overhead to IC fabrication, produce unintended topologies requiring additional fabrication steps to eliminate, introduce defects, degrade device performance, etc.

DETAILED DESCRIPTION

Figure 1A:
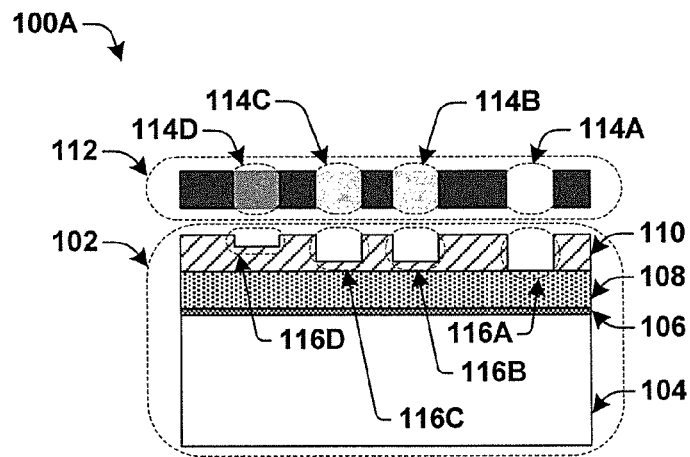
FIGS. 1A-1F illustrate cross-sections of some embodiments of a processing flow to form a plurality of shallow trench isolations comprising multiple trench depths utilizing a single photo exposure and a single etch process with a grayscale mask.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Advanced technology node scaling in conjunction with maintained or even improved device performance over prior nodes drives an electrical isolation requirement of a high voltage (HV) device region comprising one or more HV device from a low voltage (LV) device region comprising one or more LV device. For complementary metal oxide semiconductor (CMOS) devices formed on silicon substrates a shallow trench isolation (STI) may be employed wherein a portion of the substrate is etched to form a trench between the HV device region and the LV device region, and filled with an oxide (e.g., $SiO_2$) to provide electrical isolation. Integrated circuit (IC) or system on chip (SoC) applications requiring multiple voltage domains drive an independent fabrication flow for each device type, wherein one or more fabrication steps is repeated more than once (e.g., once per device type). Additionally, topologies created by height differences between LV devices and HV devices also drive multi-depth trench requirements to form via contacts to a gate electrode or a conductive interconnect from a planar metallization level. Utilization of a single photo exposure in conjunction with a single etch process to contact LV devices and HV devices with differing heights can result in over-etching and punch through of an etch stop layer, resulting in a poor contact to the gate electrode or a conductive interconnect.

Some prior art approaches achieve multiple STIs for multiple device types by utilizing multiple photo exposures in conjunction with multiple etch processes, which adds overhead to IC fabrication, can produce unintended topologies requiring additional fabrication steps to eliminate, introduce defects, etc. Moreover, these approaches result in hard mask topologies comprising multiple thickness regions (i.e., one thickness for each etch process), hindering complete removal of the hard mask by a single selective etch process as the selective etch process is calibrated to a uniform hard mask thickness. Prior art methods comprising multiple photo exposures and multiple etch processes also result in a staircase STI structures, wherein STIs formed for different device types protrude from the substrate by different amounts after hard mask removal. Devices formed within a vicinity of a staircase STI structures are subject to increased device variability over devices formed under nominal fabrication conditions comprising uniform STI height.

Accordingly, the present disclosure relates to a method to form a plurality of openings comprising multiple depths within a substrate with a single photo exposure and a single etch process. A photoresist layer is disposed over a substrate and aligned with a photomask, wherein the photomask comprises a transparent area, a grayscale area, and an opaque area. The photomask and substrate are exposed to radiation comprising a single illumination step to form a first 3-dimensional (3D) pattern within the photoresist layer. The 3D pattern comprises a first opening comprising a first thickness formed by transmitting the radiation through the transparent area with full intensity, and a second opening comprising a second thickness formed by transmitting the radiation through the grayscale area with partial intensity. The 3D pattern is transferred to form a plurality of openings of varying depths within the substrate through a single etch process wherein a respective opening depth corresponds to a thickness of a respective hard mask opening from which the opening is formed.

FIGS. 1A-1F illustrate a cross-section of some embodiments of a processing flow to form a plurality of shallow trench isolations comprising multiple trench depths utilizing a single photo exposure and a single etch process with a grayscale mask. FIG. 1A illustrates a cross-section of a complementary metal oxide semiconductor (CMOS) device structure 100A comprising a substrate 102 further comprising a silicon layer 104, an oxide layer 106 disposed over the silicon layer 104, a hard mask layer 108 (e.g., SiN) disposed over the oxide layer 106, wherein a top surface of the substrate 102 comprises an interface between the hard mask layer 108 and a photoresist layer 110 disposed over the substrate 102. A photomask 112 is aligned with the top surface of the substrate 102, wherein the photomask 112 comprises a transparent area 114A, a first grayscale area 114B, a second grayscale area 114C, a third grayscale area 114D, and a plurality of opaque areas. The photomask 112 and substrate 102 are exposed to radiation comprising a single illumination step to form a first 3D pattern within the photoresist layer 110. The first 3D pattern comprises a first photoresist opening 116A comprising a first depth formed by transmitting the radiation through the transparent area 114A with full intensity, a second photoresist opening 116B comprising a second depth formed by transmitting the radiation through the first grayscale area 114B with a first partial intensity, wherein the first partial intensity is less than the full intensity, a third photoresist opening 116C comprising approximately the second depth formed by transmitting the radiation through second grayscale area 114C with approximately the first partial intensity, and a fourth photoresist opening 116D formed by transmitting the radiation through the third grayscale area 114D with a second partial intensity that is less than the first partial intensity. As a result, the first photoresist opening 116A comprises a first photoresist depth that is approximately a thickness of the photoresist layer 110 (or photoresist thickness), the second photoresist opening 116B and the third photoresist opening 116C each comprise approximately a second photoresist depth that is less than the first photoresist depth, and the fourth photoresist opening 116D comprises a third photoresist depth that is less than the second photoresist depth.

Figure 1B:
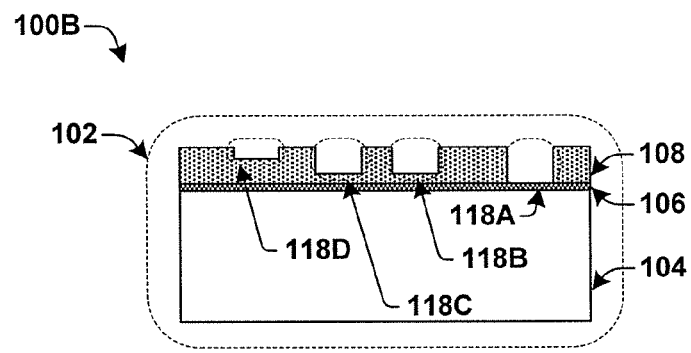

FIG. 1B illustrates some embodiments of a cross-section of a CMOS device structure 100B, comprising the CMOS device structure 100A wherein the photoresist layer 110 has been removed and the first 3D pattern has been transferred to form a second 3D pattern within the hard mask layer 108. Transfer of the first 3D pattern further comprises a single etch step comprising etching the first photoresist opening 116A through the photoresist layer 110 into the hard mask layer 108 to form a first hard mask opening 118A comprising a first hard mask depth within the hard mask layer 108, simultaneously etching the second photoresist opening 116B to form a second hard mask opening 118B further comprising a second hard mask depth, simultaneously etching the third photoresist opening 116C to form a third hard mask opening 118C comprising the second hard mask depth, and simultaneously etching the fourth photoresist opening 116D to form a fourth hard mask opening 118D comprising a third hard mask depth.

Figure 1C:
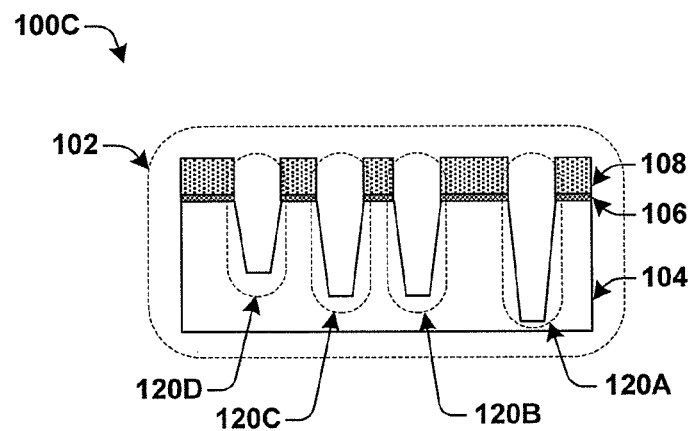

FIG. 1C illustrates some embodiments of a cross-section of a CMOS device structure 100C comprising the CMOS device structure 100B, wherein the second 3D pattern has been etched into the silicon layer 104 to form the plurality of trenches 120A-120D within the substrate 102 through the single etch step, further comprising etching the first hard mask opening 118A through the hard mask layer 108A to form a first trench 120A comprising a first trench depth within the substrate 102, simultaneously etching the second hard mask opening 118B to form a second trench 120B comprising a second trench depth, simultaneously etching the third hard mask opening 118C to form a third trench 120C comprising the second trench depth, and simultaneously etching the fourth hard mask opening 118D to form a fourth trench 120D comprising a third trench depth. Note that a respective trench depth for trenches 120A-120D corresponds to a thickness of the respective hard mask opening 118A-118D from which the respective trenches 120A-120D is formed, wherein the thickness of a respective hard mask opening 118A-118D is equal to the difference between the hard mask thickness and the hard mask depth of the respective hard mask opening 118A-118D. Note further that the hard mask layer 108 comprises a uniform thickness after etching the second 3D pattern to form trenches 120A-120D within the substrate.

Figure 1D:
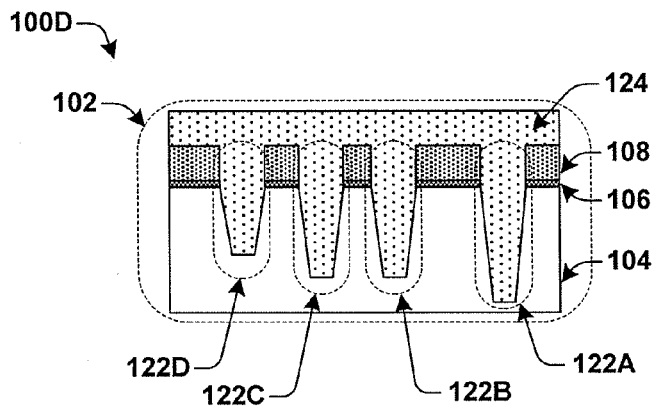

FIG. 1D illustrates some embodiments of a cross-section of a CMOS device structure 100D, wherein the trenches 120A-120D of the CMOS device structure 100C have been filled with an oxide material 124 (e.g., $SiO_2$) to form a first through fourth shallow trench isolations (STIs) 122A-122D, respectively, wherein a respective STI 122A-122D is configured to electrically isolate one or more devices disposed within a vicinity of the respective STI 122A-122D from leakage effects of other nearby devices.

Figure 1E:
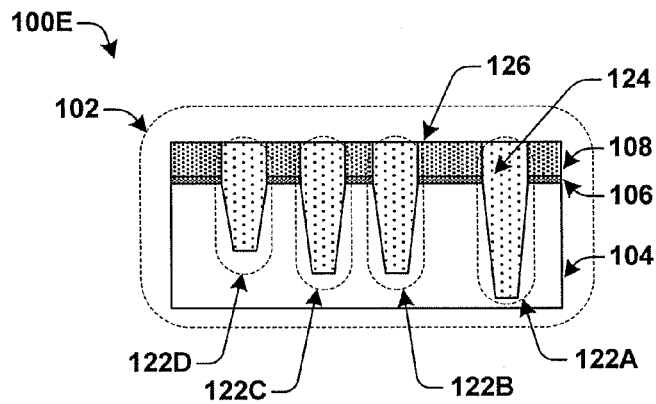

FIG. 1E illustrates some embodiments of a cross-section of a CMOS device structure 100E wherein an excess of the oxide material 124 disposed above the top surface of the CMOS device structure 100D has been removed via a chemical-mechanical polish (CMP) to form an essentially flat surface 126. Note that prior art approaches utilizing multiple photo exposures in conjunction with multiple etch processes result in removal of part of the hard mask 108 such that the (remaining) hard mask 108 comprises multiple thicknesses, complicating removal of the hard mask 108 with a single selective etch process as the selective etch process that is calibrated to a uniform hard mask thickness. A shoulder located at an interface between two regions of differing thickness within a hard mask 108 subject to multiple photo exposures and multiple etch processes may result in an accumulation of residue from the hard mask 108 after hard mask removal, posing a yield risk resulting from salicide (i.e., self-aligned silicide) malformation in subsequent fabrication steps, resulting in isolation of devices formed in the vicinity of STIs 122A-122D from metallization contacts by the hard mask (108) residue. Accordingly, the embodiments of FIGS. 1A-1E offer relief for etch removal of the hard mask 108, as the hard mask 108 the embodiments of FIGS. 1A-1E comprises a uniform thickness.

Figure 1F:
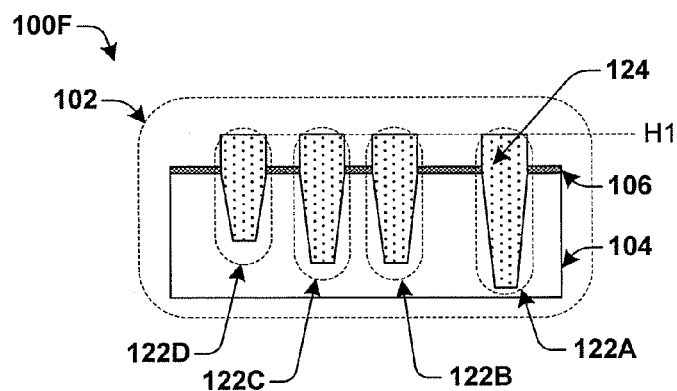

FIG. 1F illustrates some embodiments of a cross-section of a CMOS device structure 100F wherein the hard mask 108 has been removed from the CMOS device structure 100E. As a result of the uniform hard mask thickness, STIs 122A-122D protrude from the substrate 102 by a height H1 approximately equal to the thickness of the hard mask layer 108. Prior art methods comprising multiple photo exposures and multiple etch processes result in a staircase STI structure (i.e., multiple STI protrusions comprising multiple heights). Devices formed within a vicinity of a staircase STI structure are subject to increased device variability over devices a formed in a vicinity of STI structures comprising a uniform height, as the height variability of staircase STI structure increases gate poly variability and source drain diffusion variability of nearby devices, which may be observed electrically as a degraded saturation current uniformity between the nearby devices.

Figure 2A:
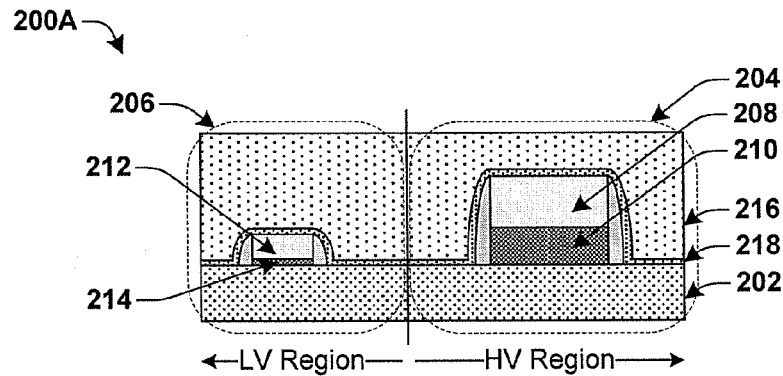
FIGS. 2A-2C illustrate cross-sections of some embodiments of a processing flow to form a plurality of vias comprising multiple via heights utilizing a single photo exposure and a single etch process in conjunction with a grayscale mask.
Figure 2B:
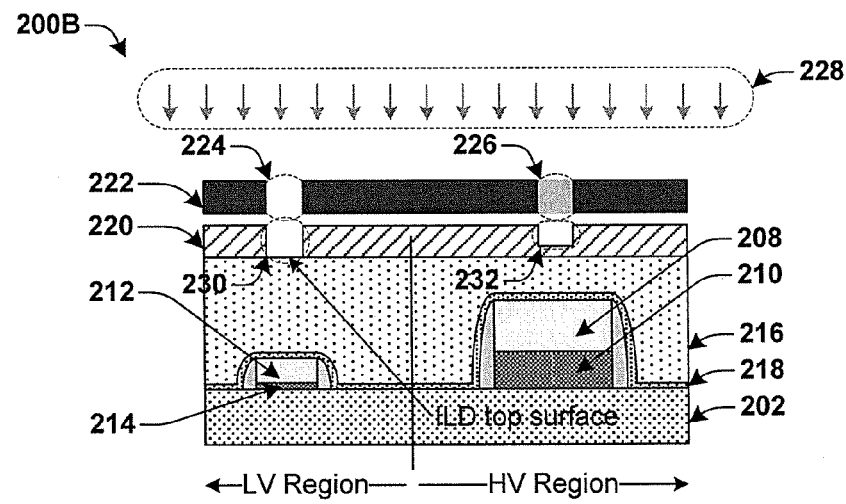
Figure 2C:
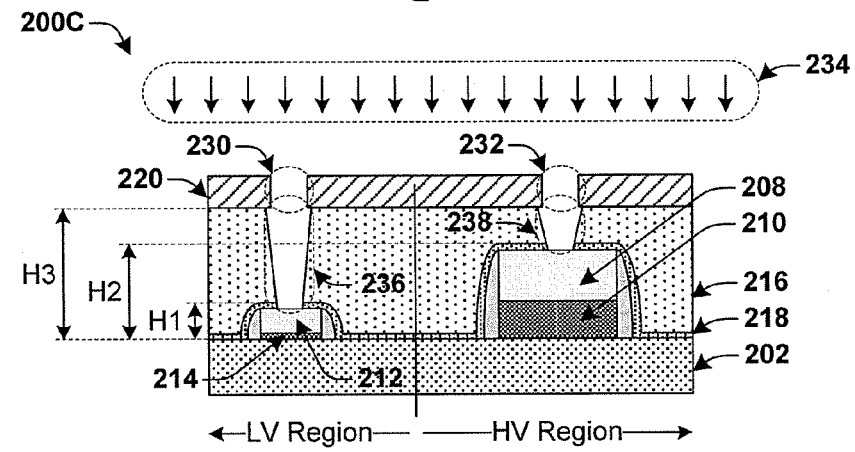

FIGS. 2A-2C illustrate cross-sections of some embodiments of a processing flow to form a plurality of vias comprising multiple via heights utilizing a single photo exposure and a single etch process in conjunction with a grayscale mask. FIG. 2A illustrates a cross-section of a CMOS device structure 200A formed on an Si substrate 202 comprising a high voltage (HV) device region 204 and a low voltage (LV) device region 206. The HV device region 204 further comprises an HV FET comprising a first gate poly 208 disposed over an HV gate oxide 210, and the LV device region 206 further comprises an LV FET comprising a second gate poly 212 disposed over an LV gate oxide 214. The HV device region 204 and the LV device region 206 are disposed over the Si substrate 202 within an inter-layer dielectric (ILD) 216 and segregated from the ILD 216 by an etch stop 218.

FIG. 2B illustrates a cross-section of the CMOS device structure 200A, wherein a photoresist 220 has been disposed over a substrate top surface comprising an ILD 216 top surface. A photomask 222 is provided, wherein the photomask 222 comprises a transparent area 224 and a grayscale area 226. The substrate top surface is aligned with the photomask 222 and exposed to radiation 228, wherein the transparent area 224 transmits the radiation with full intensity to form a first opening 230 in the photoresist layer, and the grayscale area 226 transmits the radiation with partial intensity to form a second opening 232 in the photoresist 220, resulting in a cross-section of the CMOS device structure 200B. The first opening 230 exposes a portion of the substrate (e.g., the substrate top surface) and the second opening 232 comprises a bottom surface of photoresist.

FIG. 2C illustrates a cross-section of the CMOS device structure 200C, wherein CMOS device structure 200B has been etched by a plasma etch process 234 comprising an ionized gas (e.g., $C_xH_yF_z$ where x, y, and z denote variable molar concentration, $O_2$, HBr, $Cl_2$, etc.) incident upon the ILD 216 with a dose and energy sufficient to etch the ILD 216 through the first opening 230 to form a first trench 236 by a single etch step which simultaneously etches the ILD 216 through the second opening 232 to form a second trench 238, for the purpose of forming device contacts to one or more conductive features comprising a gate electrode or a conductive interconnect for the HV device and LV device. For the embodiments of FIGS. 2A-2C the first trench 236 and the second trench 238 are filled with a conductive material comprising copper to form a first via contact to a first gate electrode of the HV device (i.e., first gate poly 208), and a second via contact to a second gate electrode of the LV device (i.e., second gate poly 212), respectively. A first depth of the first trench 236 is approximately equal to a difference between ILD thickness H3 and a first height H1 of an LV gate formed from the combined second gate poly 212 and the LV gate oxide 214. Likewise, a second depth of the second trench 238 is approximately equal to a difference between ILD thickness H3 and a second height H2 of an HV gate formed from the combined first gate poly 208 and the HV gate oxide 210.

In some embodiments, fabrication of the cross-section of the CMOS device structure 200C comprises deposition of approximately 8,000 angstroms of the ILD 216 on the Si substrate 202 followed by a CMP of the ILD 216 to approximately 4,100 angstroms. The first height H1 of the LV gate comprises a value of approximately 1,650 angstroms and the second height H2 of an HV gate comprises a value of approximately 2,800 angstroms. This leaves a topographical difference between H1 and H2 of approximately 1,150 angstroms, and determines the difference between the first depth of the first trench 236 and the second depth of the second trench 238.

The plasma etch process 234 comprises etching of the ILD 216 with a calibrated etch selectivity between the ILD 216 and the photoresist 220. Plasma (234) incident upon the first opening 230 immediately etches the ILD 216 as the first opening 230 exposed the ILD (216) top surface. Plasma (234) simultaneously incident upon the second opening 232 must first etch away remaining photoresist below the bottom surface of photoresist (220) of the second opening 232. As a result, the first trench 236 will etch deeper than the second trench 238. The first trench 236 and the second trench 238 are subsequently filled with a conductive material (e.g., copper) to form a first via comprising approximately the first depth and a second via comprising approximately the second depth, respectively, wherein the first via forms a connection to the LV gate and the second via forms a connection to the HV gate.

For a given topographical difference between H1 and H2, calibrating the etch selectivity comprises calibrating a type, dose, and energy of the plasma etch process 234 tunes etch selectivity between the substrate and the photoresist 220. In some embodiments, tuning illumination conditions for radiation 228 in FIG. 2B expands a range of etch selectivity such that the photomask 222 comprising a plurality of distinct transparencies may be calibrated such that the transparencies produce a first topography within the photoresist 220. The first topography, when etched by the calibrated plasma etch process (234), produces a second topography within the ILD 216. The absence of such a calibration due to a photomask 222 comprising a single transparency results in the first opening 230 and the second opening 232 with approximately the same depth. In this instance, regardless of calibrated etch selectivity between the ILD 216 and the photoresist 220, the first trench 236 and the second trench 238 will etch to approximately the same depth for a uniform photoresist thickness. For a topographical difference between H1 and H2 above a threshold, the second trench 238 will over-etch, breaking through of the etch stop 218, and resulting in a poor contact to the first gate poly 208.

Figure 3:
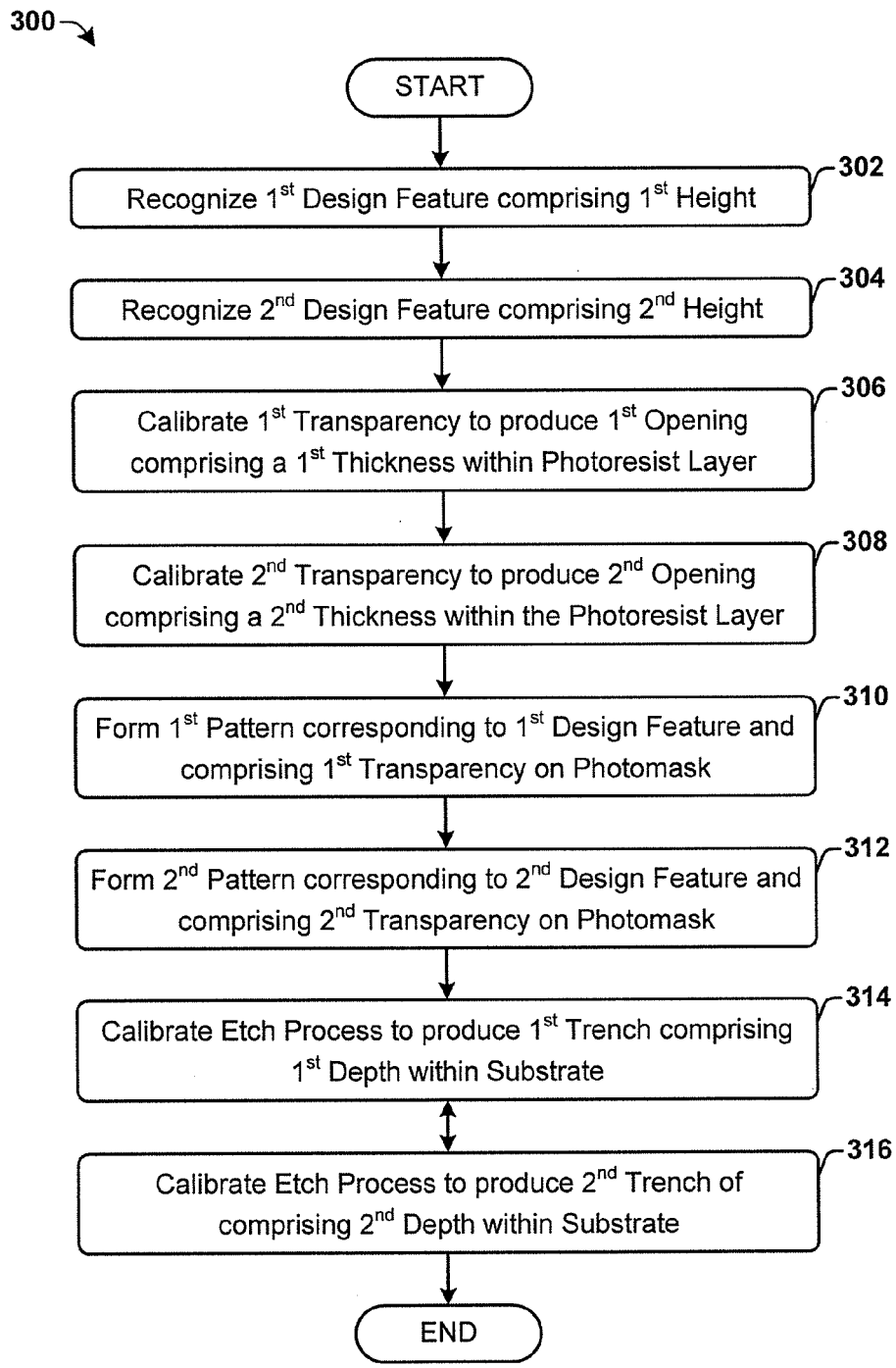
FIG. 3 illustrates some embodiments of a method of photomask definition for optical lithography resulting in multiple trench depths from a single photo exposure and a single etch process.

A photomask comprising a transparent area and one or more grayscale areas of varying transparencies may be utilized in conjunction with a single photo exposure and single etch process to form multiple trench depths. Such a photomask may be correlated to a physical design and single illumination process by recognizing topologies within the physical design, and calibrating the transparencies of the photomask in conjunction with the single etch process to achieve a variety of trench depths required to contact the various topologies within the physical design. FIG. 3 illustrates some embodiments of a method 300 of photomask definition for optical lithography resulting in multiple trench depths from a single photo exposure and a single etch process. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 a first design feature within a chip region comprising a first height is recognized, wherein the first design feature further comprises a first conductive feature such as a gate electrode or a conductive interconnect.

At 304 a second design feature within the chip region comprising a second height is recognized, wherein the second design feature further comprises a second conductive feature such as a gate electrode or a conductive interconnect.

At 306 a first transparency of a photomask is calibrated to produce a first opening of a first thickness in a photoresist layer disposed on a substrate under a set of illumination conditions, comprising an illumination configuration (e.g., dipole illumination, quadrapole illumination, etc.), focus, dose, etc. In some embodiments the first transparency comprises essentially a total transparency of radiation incident upon the photomask such that the first opening comprises a maximum depth of all openings formed by the photomask (i.e., minimum thickness).

At 308 a second transparency of the photomask is calibrated to produce a second opening of a second thickness in the photoresist layer under the set of illumination conditions. In some embodiments the second transparency comprises a partial transparency, or grayscale transparency, such that radiation incident upon the photomask is transmitted with only a fraction of an intensity of the incident radiation, resulting in the second opening comprising a depth less than the maximum depth formed in the photoresist by the first transparency. Note that the second transparency may be calibrated relative to the first transparency to vary the depth of the second opening in the photoresist relative to the depth of the first opening in the photoresist.

At 310 a first pattern corresponding to the first design feature is formed on the photomask, wherein the first pattern comprises the first transparency.

At 312 a second pattern corresponding to the second design feature is formed on the photomask, wherein the second pattern comprises the second transparency.

At 314 an etch process is calibrated to etch the first opening into the substrate to form a first recess comprising a first depth approximately equal to a difference between a third thickness of the substrate and the first height of the first design feature disposed within the substrate. In some embodiments, calibrating the etch process further comprises calibrating a type, dose, and energy of the etch process to define etch selectivity between the substrate and the photoresist.

At 316 the etch process is calibrated simultaneously to 314 to etch the second opening into the substrate to form a second recess comprising to a second depth approximately equal to a difference between the third thickness of the substrate and the second height of the second design feature disposed within the substrate.

Figure 4:
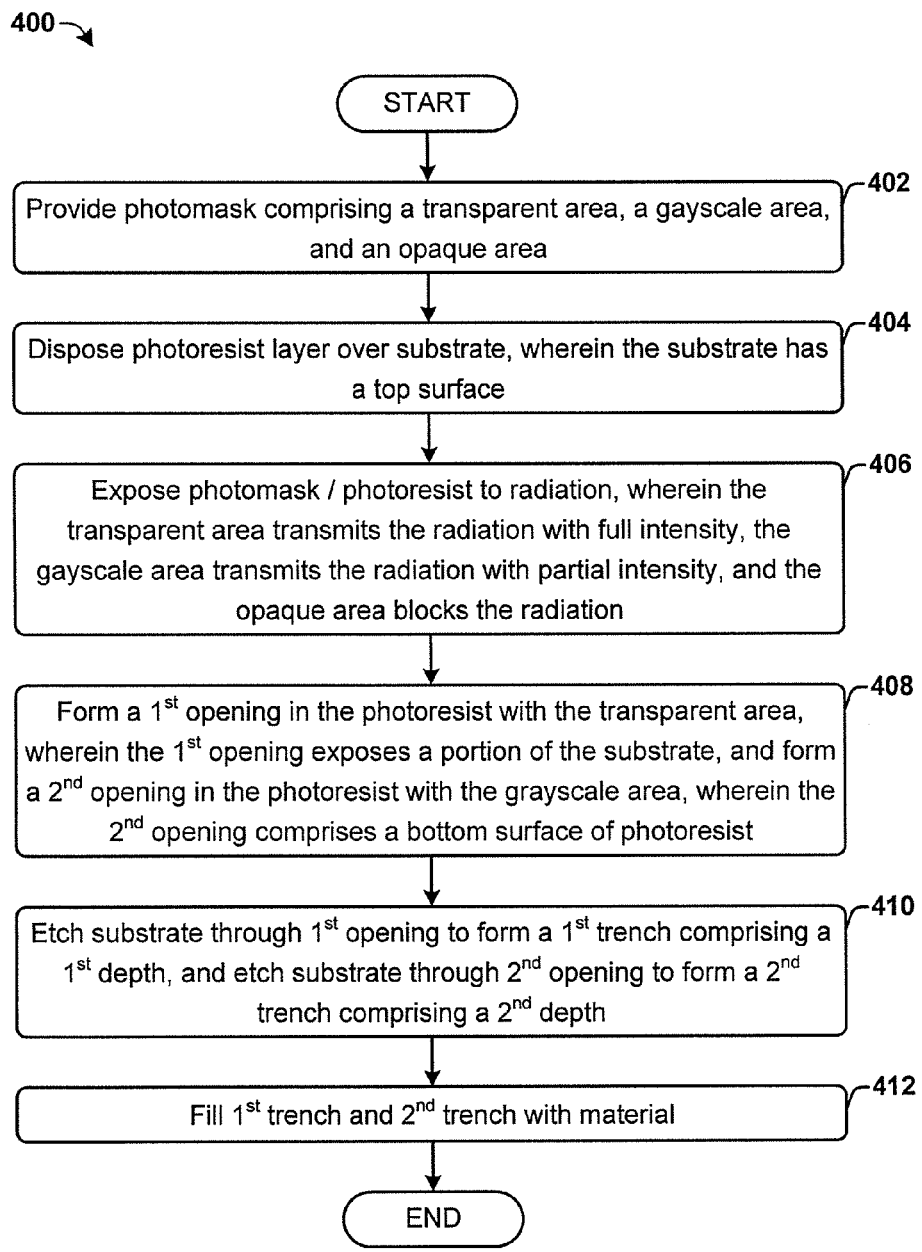
FIG. 4 illustrates some embodiments of a method to form a plurality of trenches comprising multiple trench depths utilizing a single photo exposure and a single etch process with a grayscale mask.

FIG. 4 illustrates some embodiments of a method 400 to form a plurality of trenches comprising multiple trench depths utilizing a single photo exposure and a single etch process with a grayscale mask. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402 a photomask is provided, wherein the photomask comprises a transparent area, a grayscale area, and an opaque area.

At 404 a photoresist layer is disposed over a substrate, wherein the substrate has a top surface.

At 406 the photomask is aligned to the top surface of the substrate. The photomask and the substrate are exposed to radiation, wherein the transparent area transmits the radiation with full intensity, the grayscale area transmits the radiation with partial intensity, and the opaque area blocks the radiation.

At 408 a first opening is formed in the photoresist with the transparent area, wherein the first opening exposes a portion of the substrate, and a second opening is simultaneously formed in the photoresist with the grayscale area, wherein the second opening comprises a bottom surface of photoresist.

At 410 the substrate is etched through the first opening to form a first trench comprising a first depth. Simultaneously, the substrate is etched through the second opening to form a second trench comprising a second depth, wherein the first depth is greater than the second depth.

At 412 the first trench and the second trench are filled with a material. In some embodiments, the first trench and the second trench are filled with an oxide material to form a first shallow trench isolation comprising approximately the first depth and a second shallow trench isolation comprising approximately the second depth, respectively. In some embodiments, the top surface of the substrate comprises a dielectric layer disposed over a first conductive feature comprising a first height and a second conductive feature comprising a second height, wherein the first height is less than the second height, and wherein the first conductive feature or the second conductive feature further comprise a gate electrode or a conductive interconnect. The first trench and the second trench disposed within the dielectric layer are filled with a conductive material (e.g., copper, aluminum, etc) to form a first via comprising approximately the first trench depth and a second via comprising approximately the second trench depth, respectively. In some embodiments, the first trench depth is approximately equal to a first difference between a dielectric thickness the first height of the first conductive feature, and the second trench depth is approximately equal to a second difference between the dielectric thickness and the second height of the second conductive feature, wherein the first via connects to the first conductive feature and the second via connects to the second conductive feature.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method to form a plurality of trenches comprising multiple depths within a substrate with a single photo exposure and a single etch process. A photoresist layer is disposed over a substrate and aligned with a photomask, wherein the photomask comprises a transparent area, a grayscale area, and an opaque area. The photomask and substrate are exposed to radiation comprising a single illumination step to form a first 3-dimensional pattern within the photoresist layer. The 3-dimensional pattern comprises a first opening comprising a first thickness formed by transmitting the radiation through the transparent area with full intensity, and a second opening comprising a second thickness formed by transmitting the radiation through the grayscale area with partial intensity. The 3-dimensional pattern is transferred to form a plurality of trenches of varying depths within the substrate through a single etch process wherein a respective trench depth corresponds to a thickness of a respective hard mask opening from which the trench is formed.

In some embodiments the present disclosure relates to a method to form multiple openings, comprising providing a photomask comprising a transparent area, a grayscale area, and an opaque area, aligning the photomask to a substrate, and exposing the photomask and the substrate to radiation, wherein the transparent area transmits the radiation with full intensity to form a first opening in a photoresist layer disposed over the substrate, the grayscale area transmits the radiation with partial intensity to form a second opening in the photoresist, and the opaque area blocks the radiation. The first opening exposes a portion of the substrate, and the second opening comprises a bottom surface of photoresist. The substrate is etched through the first opening to form a first trench comprising a first trench depth, and simultaneously etched through the second opening to form a second trench comprising a second trench depth, wherein the first trench depth is greater than the second trench depth. The first trench depth and second trench depth are calibrated to coincide with a first conductive feature comprising a first height and a second conductive feature comprising a second height, wherein the first conductive feature and the second conductive feature are disposed over the substrate. The first trench and the second trench are then filled with a material.

In some embodiments the first trench and the second trench are filled with an oxide material to form a first shallow trench isolation comprising approximately the first trench depth and a second shallow trench isolation comprising approximately the second trench depth, respectively, for device isolation within the substrate. In some embodiments the first trench and the second trench are formed within a dielectric layer disposed over a first conductive feature and a second conductive feature, wherein the first conductive feature or the second conductive feature further comprise a gate electrode or a conductive interconnect. The first trench and the second trench are with a conductive material to form a first via connecting to the first conductive feature and a second via connecting to the second conductive feature.

In some embodiments a method of photomask definition for optical lithography is disclosed, wherein a first design feature comprising a first height and a second design feature comprising a second height are recognized. A first pattern corresponding to the first design feature is formed on a photomask, wherein the first pattern comprises a first transparency, and a second pattern corresponding to the second design feature is formed on the photomask, wherein the second pattern comprises a second transparency. The first transparency and the second transparency are calibrated to produce a first opening of a first thickness in a layer photoresist and a second opening of a second thickness in the layer photoresist, respectively. An etch process is further calibrated to etch the first opening into a substrate to form a first recess comprising and a second recess, wherein the first recess comprising and the second recess align with surface topologies of the substrate.

In some embodiments a method to form a plurality of openings within a substrate is disclosed, comprising forming a hard mask layer comprising a thickness over a top surface of a substrate, forming a photoresist layer over the hard mask layer, aligning a photomask to the top surface of the substrate, wherein the photomask comprises a transparent area, a grayscale area, and an opaque area, and exposing the photomask and substrate to radiation comprising a single illumination step to form a first 3-dimensional (3D) pattern within the photoresist layer, the first 3D pattern comprising the first 3D pattern is transferred to the hard mask layer to form a second 3D pattern in a single etch step. The second 3D is pattern to form the plurality of trenches within the substrate through the second single etch step, wherein a respective trench depth corresponds to a thickness of a respective hard mask opening.

What is claimed is:

1. A method to form multiple openings, comprising:
  providing a photomask comprising a transparent area, a grayscale area, and an opaque area;
  forming a photoresist layer having a photoresist thickness over a substrate, wherein the substrate has a top surface comprising:
    a dielectric layer disposed over a first conductive feature, the first conductive feature comprising a first height;
    a second conductive feature comprising a second height;
    wherein the first conductive feature and the second conductive feature are disposed over the substrate; and
    wherein the first height is less than the second height;
  exposing the photoresist layer to radiation according to the photomask, wherein the transparent area transmits the radiation with full intensity, the grayscale area transmits the radiation with partial intensity, and the opaque area blocks the radiation;
  forming a first opening in the photoresist layer in a first area exposed with the transparent area, wherein the first opening exposes a portion of the substrate;
  forming a second opening in the photoresist layer in a second area exposed with the grayscale area, wherein the second opening comprises a bottom surface of photoresist;
  etching the substrate through the first opening to form a first trench comprising a first trench depth; and
  etching the substrate through the second opening to form a second trench comprising a second trench depth, wherein the first trench depth is greater than the second trench depth.

2. The method of claim 1, wherein the top surface of the substrate comprises a hard mask disposed over an oxide layer which is disposed over a silicon substrate.

3. The method of claim 2, further comprising filling the first trench and the second trench with an oxide material to form a first shallow trench isolation comprising approximately the first trench depth and a second shallow trench isolation comprising approximately the second trench depth, respectively.

4. The method of claim 1, further comprising filling the first trench and the second trench with a conductive material to form a first via comprising approximately the first trench depth and a second via comprising approximately the second trench depth, respectively.

5. The method of claim 4, wherein:
  the first trench depth is approximately equal to a first difference between a dielectric thickness of the dielectric layer and the first height of the first conductive feature; and
  the second depth of the second trench is approximately equal to a second difference between the dielectric thickness of the dielectric layer and the second height of the second conductive feature.

6. The method of claim 5, further comprising:
  connecting the first via to the first conductive feature; and
  connecting the second via to the second conductive feature.

7. The method of claim 1, wherein etching the substrate further comprises calibrating a type, dose, and energy of a plasma etch to define an etch selectivity between the substrate and the photoresist.

8. The method of claim 1,
  wherein the first trench depth is less than the photoresist thickness, such that a bottom surface of the first opening is formed by the photoresist layer; and
  wherein the second trench depth is less than the photoresist thickness, such that a bottom surface of the second opening is also formed by the photoresist layer.

9. A method to form a plurality of openings within a substrate, comprising:
  forming a hard mask layer comprising a hard mask thickness over a top surface of the substrate;
  forming a photoresist layer having a photoresist thickness over the hard mask layer;
  providing a photomask, which comprises a transparent area, a grayscale area, and an opaque area; and
  exposing the photoresist layer to radiation according to the photomask to form a first 3-dimensional pattern within the photoresist layer, the first 3-dimensional pattern comprising:
    a first opening comprising a first photoresist depth formed by transmitting the radiation through the transparent area with full intensity, wherein the first photoresist depth is less than the photoresist thickness, such that a bottom surface of the first opening is formed by the photoresist layer; and a second opening comprising a second photoresist depth formed by transmitting the radiation through the grayscale area with partial intensity, wherein the second photoresist depth is less than the first photoresist depth, such that a bottom surface of the second opening is also formed by the photoresist layer;

transferring the first 3-dimensional pattern to form a second 3-dimensional pattern within the hard mask layer through a single etch step comprising:

etching the first photoresist opening through the photoresist layer into the hard mask layer to form a first hard mask opening comprising a first hard mask depth within the hard mask layer; and etching the second photoresist opening through the photoresist layer into the hard mask layer to form a second hard mask opening comprising a second hard mask depth within the hard mask layer; and etching the second 3-dimensional pattern to form the plurality of openings within the substrate through a single etch step comprising:

etching the first hard mask opening through the hard mask layer to form a first trench comprising a first trench depth within the substrate;

simultaneously etching the second hard mask opening through the hard mask layer to form a second trench comprising a second trench depth within the substrate; and wherein a trench depth corresponds to a thickness of a respective hard mask opening.

10. The method of claim 9, further comprising filling the first trench and the second trench with an oxide material to form a first shallow trench isolation and a second shallow trench isolation, respectively.

11. The method of claim 10, wherein the hard mask layer comprises a uniform thickness after etching the second 3-dimensional pattern to form the first trench and second trench within the substrate.

12. The method of claim 11, further comprising:

removing an excess of the oxide material formed above the hard mask layer during shallow trench isolation with a chemical-mechanical polish;

removing the hard mask layer; and wherein the first shallow trench isolation and the second shallow trench isolation both protrude from the substrate by a height approximately equal to the hard mask thickness.

13. A method, comprising:

providing a photomask comprising a transparent area, a grayscale area, and an opaque area;

disposing a photoresist layer over a top surface of a substrate, wherein the top surface of the substrate comprises an inter-layer dielectric disposed over first and second conductive features, wherein the first conductive feature comprises a first height, and wherein the second conductive feature comprises a second height that is greater than the first height;

exposing the photoresist layer to radiation according to the photomask, wherein the transparent area transmits the radiation with full intensity to form a first opening in the photoresist layer, wherein the grayscale area transmits the radiation with partial intensity to form a second opening in the photoresist layer, and wherein a first opening depth of the first opening is greater than a second opening depth of the second opening; and etching the substrate through the first and second openings to form first and second trenches, respectively, wherein a first trench depth of the first trench is greater than a second trench depth of the second trench.

14. The method of claim 13, further comprising filling the first trench and the second trench with a dielectric material to form first and second shallow trench isolations, respectively, wherein the first shallow trench isolation is deeper than the second shallow trench isolation.

15. The method of claim 13, further comprising filling the first trench and the second trench with a conductive material to form a first via and a second via, respectively.

16. The method of claim 13, wherein the first and second trenches are formed in the inter-layer dielectric;

wherein a sum of the first trench depth and the first height of the first conductive feature is approximately equal to a thickness of the inter-layer dielectric; and wherein a sum of the second trench depth and the second height of the second conductive feature is approximately equal to the thickness of the inter-layer dielectric.

* * * * *